(12) United States Patent
Fujikami et al.

(10) Patent No.: US 6,305,069 B1
(45) Date of Patent: *Oct. 23, 2001

(54) METHOD OF PREPARING OXIDE SUPERCONDUCTIVE WIRE

(75) Inventors: Jun Fujikami; Nobuhiro Saga; Kazuya Ohmatsu; Kenichi Sato, all of Osaka (JP)

(73) Assignee: Sumitomo Electric Industries, Inc. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/627,281

(22) Filed: Apr. 4, 1996

(30) Foreign Application Priority Data

Apr. 7, 1995 (JP) .................................................. 7-082190
Mar. 15, 1996 (JP) .................................................. 8-059184

(51) Int. Cl.$^7$ .................................................. H01L 39/24
(52) U.S. Cl. .......................... 29/599; 505/231; 505/701; 505/702; 505/703
(58) Field of Search .............................. 29/599; 505/231, 505/701, 702, 703

(56) References Cited

U.S. PATENT DOCUMENTS

| | | | |
|---|---|---|---|
| 3,131,469 | * | 5/1964 | Glaze ........................ 29/599 |
| 3,618,205 | * | 11/1971 | Barber et al. ............... 29/599 |
| 4,611,390 | * | 9/1986 | Tanaka et al. ............... 29/599 |
| 4,929,596 | * | 5/1990 | Meyer et al. ................ 29/599 X |
| 4,965,245 | * | 10/1990 | Sugimoto et al. ............ 29/599 X |
| 4,990,492 | * | 2/1991 | Creedon et al. ............. 29/599 X |
| 4,994,633 | * | 2/1991 | Puhn ........................ 29/599 X |
| 5,068,219 | * | 11/1991 | Hagino et al. .............. 29/599 X |

FOREIGN PATENT DOCUMENTS

| | | | |
|---|---|---|---|
| 0503525 A1 | * | 3/1991 | (EP) . |
| A-0 503 525 | | 9/1992 | (EP) . |
| A-0 509 436 | | 10/1992 | (EP) . |
| A-0 638 942 | | 2/1995 | (EP) . |
| WO 96/08045 | | 3/1996 | (WO) . |

* cited by examiner

Primary Examiner—Carl J. Arbes
(74) Attorney, Agent, or Firm—Pennie & Edmonds LLP

(57) ABSTRACT

Provided are an oxide superconducting wire which maintains a high critical current density and has a small current drift with small ac loss when the same carries an alternating current and a method of preparing the same, and a cable conductor which is formed by assembling such oxide superconducting wires. The oxide superconducting wire is a flat-molded stranded wire which is formed by twisting a plurality of metal-coated strands consisting of an oxide superconductor, and is characterized in that the flat-molded stranded wire has a rectangular sectional shape, and a section of each strand forming the flat-molded stranded wire has an aspect ratio (W1/T1) of at least 2. The method of preparing this oxide superconducting wire comprises the steps of preparing a stranded wire by twisting a plurality of strands, each of which is formed by metal-coating an oxide superconductor or raw material powder therefor, flat-molding the prepared stranded wire, and repeating rolling and a heat treatment of at least 800° C. on the flat molded stranded wire a plurality of times.

2 Claims, 5 Drawing Sheets

METHOD OF PREPARING OXIDE SUPERCONDUCTIVE WIRE

BACKGROUND OF THE INVENTION

1. Field of the Invention

The present invention relates to an oxide superconducting wire and a method of preparing the same, and a cable conductor which is formed by assembling such oxide superconducting wires, and more particularly, it relates to an oxide superconducting wire which can carry a heavy current in ac application and a method of preparing the same, and a cable conductor which is formed by assembling such oxide superconducting wires.

2. Description of the Background Art

The principal feature of an oxide superconductor resides in that the same is in a superconducting state also at a temperature exceeding the liquid nitrogen temperature. Therefore, a wire consisting of such an oxide superconductor is expected for application to a superconducting device, as a material which can be used under cooling with liquid nitrogen.

The inventors have developed a tape-shaped Bi-based Ag-coated multifilamentary wire, which is prepared from filaments of an oxide superconductor with a stabilizer of silver. A Bi-based Ag-coated wire can be prepared by charging a metal pipe with raw material powder serving as a precursor for a Bi oxide superconductor, wire-drawing the pipe and thereafter repeating rolling and a heat treatment a plurality of times.

On the other hand, a multifilamentary wire can be prepared by charging metal pipes with raw material powder, wire-drawing the same, engaging a plurality of such wires in a metal pipe for forming a multi-filamentary substance, further wire-drawing the same and thereafter repeating rolling and a heat treatment a plurality of times.

Among such preparation steps, the rolling step is effective for improving the orientation of crystal grains in the Bi superconductor having a plate-type crystal structure, strengthening bonding between the crystal grains and improving the density of the filaments, and regarded as being indispensable for attaining a high critical current density in preparation of a Bi-based Ag-coated wire.

Further, the aspect ratio of a section of the wire is increased by this rolling, whereby the aspect ratio of a section of each filament is also increased. This is advantageous for growth of the plate-type crystals, and a high critical current density is consequently attained.

On the other hand, the heat treatment step for the purpose of sintering is also indispensable for forming the superconductor, attaining crystal growth and strengthening bonding between the crystal grains, since the oxide superconductor is ceramics.

The Bi-based Ag-coated wire which is prepared in the aforementioned manner is excellent in bending property and capable of preparing a long wire having a critical current density exceeding $10^4$ A/cm$^2$, and hence the same is expected for application to a superconducting cable or magnet.

In ac application of such an oxide superconducting wire, however, ac loss resulting from a fluctuating magnetic field in driving comes into question. In a cable conductor which is formed by assembling superconducting wires, on the other hand, there arises a new problem to be solved such as a drift phenomenon resulting from ununiformity between impedances of the wires, which cannot be caused in dc application.

Due to a drift caused in such a manner, further, loss upon formation of the conductor is disadvantageously increased beyond the sum of ac loss values of strands.

As to such problems caused in ac application, various countermeasures have generally been studied in relation to metal superconducting wires, for example. In more concrete terms, countermeasures of arranging high resistance barrier layers around or between filaments, preparing an extra-fine multifilamentary wire from superconducting filaments, increasing the specific resistance of a matrix and the like are studied in order to reduce ac loss. In order to suppress a current drift by uniformalizing the impedances of the filaments or wires in a conductor for an ac magnet, on the other hand, countermeasures of twisting the filaments or wires, dislocating the wires or filaments and the like are studied.

In order to attain a heavy current, further, a countermeasure of further twisting primary stranded wires each prepared by twisting superconducting strands to attain a flat-molded multinary structure or the like is studied.

While a countermeasure of further twisting primarily stranded wires to attain a multinary structure or the like must be taken also in employment of the aforementioned Bi-based Ag-coated wire for ac application similarly to the metal superconducting wire, however, it is impossible to implement the aforementioned multinary structure through an oxide superconducting wire by a method which is absolutely identical to that for the metal superconducting wire. This is because a Bi-based Ag-coated multifilamentary wire indispensably requires rolling and sintering processes as described above, while no such rolling and sintering steps are required for preparing a metal superconducting wire.

Namely, it is difficult to twist wires of a Bi oxide superconductor after sintering, since the Bi oxide superconductor is ceramics which is weak against bending distortion. Even if such wires can be twisted, a high critical current density cannot be attained. Further, it is difficult to twist wires in which aspect ratios of sections are increased by rolling. Even if such wires can be twisted, a number of clearances are defined in the stranded wire as compared with that prepared by twisting round wires, and a high critical current density cannot be attained.

SUMMARY OF THE INVENTION

In order to solve the aforementioned problems, an object of the present invention is to provide an oxide superconducting wire which maintains a high critical current density and has a small current drift with small ac loss when the same carries an alternating current and a method of preparing the same, and a cable conductor which is formed by assembling such oxide superconducting wires.

According to an aspect of the present invention, an oxide superconducting wire is provided. This oxide superconducting wire is a flat-molded stranded wire which is formed by twisting a plurality of metal-coated strands consisting of an oxide superconductor, and is characterized in that the flat-molded stranded wire has a rectangular sectional shape, and a section of each strand forming the flat-molded stranded wire has an aspect ratio of at least 2.

Throughout the specification, the term "aspect ratio" indicates the ratio of the thickness to the width in a cross section of the oxide superconducting wire.

Superconducting filaments provided in the strands can be brought into flat shapes having a high aspect ratio by setting the strands at an aspect ratio of at least 2. Consequently, a superconducting wire having a high critical current density can be obtained. In particular, the aspect ratio of the superconducting filaments is preferably around 10. The section of each strand preferably has an aspect ratio of not more than 20. It is difficult to increase the aspect ratio of the strands beyond 20 in case of twisting and molding the same.

According to the present invention, the strands are completely dislocated due to the twisting, whereby the impedances of the strands forming the stranded wire can be equalized to each other.

According to the present invention, further, the stranded wire has a rectangular sectional shape. Thus, the wire can be densely wound to be advantageously compacted when the same is applied to a coil or a cable.

Preferably, the metal coatings of the strands consist of silver or a silver alloy, and coating layers consisting of a material having higher resistance than silver are provided on the outer peripheries of the metal coatings.

Due to the presence of such coating layers, the strands can be prevented from bonding in the stranded wire, so that ac loss is effectively reduced.

The material having higher resistance than silver is prepared from a high resistance metal material or an inorganic insulating material, for example.

When no such coating layers consisting of a material having higher resistance than silver such as a high resistance metal material or an inorganic insulating material are present, metal matrices of silver or the like are so diffused during the heat treatment that the strands are disadvantageously bonded with each other, and hence bonding loss between the strands may be increased. The coating layers having higher resistance than silver effectively function to reduce such bonding loss.

The high resistance material is prepared from an Ag—Mn alloy, an Ag—Au alloy, or Ni or Cr having high resistance, for example.

On the other hand, the inorganic insulating material is prepared from an oxide insulating material such as MgO or CuO which is obtained by oxidizing Mg or Cu, for example. Bonding between the strands can be completely prevented by the coating layers consisting of such an insulating material. Further, the effect of dislocation is rendered further complete.

According to another aspect of the present invention, a method of preparing an oxide superconducting wire is provided. This method comprises the steps of preparing a stranded wire by twisting a plurality of strands each formed by metal-coating an oxide superconductor or raw material powder therefor, flat-molding the prepared stranded wire, and repeating rolling and a heat treatment of at least 800° C. on the flat-molded stranded wire a plurality of times.

Namely, a plurality of round wire type strands each formed by metal-coating an oxide superconductor or raw material powder therefor, which are not sintered as wires, are prepared. Then, the plurality of strands are twisted for preparing a stranded wire. As to the number of twisted strands, three, seven or twelve strands can be twisted, for example.

This stranded wire is flat-molded and thereafter further rolled, whereby superconducting filaments having circular sections which are provided in the strands can be deformed in the form of flat plates having a high aspect ratio. The dimensions of the superconducting filaments are preferably within the ranges of 0.1 to 100 $\mu$m in thickness and 1 $\mu$m to 1 mm in width. In the flat-molding, the superconducting filaments can be simultaneously deformed by application of rolling loads from above and under the wire.

Thereafter the step of performing rolling and a heat treatment is carried out at least twice, whereby an oxide superconducting wire in which strands are completely dislocated in order to cope with application to an ac wire can be obtained.

According to the present invention, the respective filaments are subjected to twisting as well as rolling. In the inventive wire, therefore, the impedances of the respective filaments are uniformalized by twisting. Also when the wire carries an alternating current, therefore, the current can be uniformly fed to the respective filaments. Further, bonding currents between the filaments are suppressed for effectively reducing ac loss. When the surfaces of the strands are insulated, it is possible to further suppress the bonding currents and reduce the ac loss.

According to the present invention, the flat-molded stranded wire rolled and heat treated. Thus, a high critical current density can also be attained by strengthening grain bonding which is broken by distortion in formation of the stranded wire and regularizing disturbed orientation.

According to the present invention, further, it is also possible to prepare a flat-molded multinary stranded wire by further twisting a plurality of primary stranded wires each obtained by twisting a plurality of strands. As to the number of twisted stranded wires, nine primary stranded wires can be twisted, for example.

It is particularly important to carry out the twisting step a plurality of times, in order to attain the aforementioned effects when the number of strands which are twisted for the purpose of attaining a high capacitance is increased.

According to the present invention, further, a stranded wire may be prepared by stacking and integrating a plurality of tape-shaped strands with each other and thereafter twisting the same. Particularly in case of a silver sheath Bi 2223 superconducting wire, it is important to prepare tape-shaped strands for attaining a high critical current density. Twisting is simplified by stacking the tape-shaped strands with each other for reducing the aspect ratio of sections thereof and thereafter twisting the same, and characteristic deterioration caused by bending distortion or the like can be effectively prevented.

The strands can be integrated with each other by a method of heat treating the stacked strands and bonding the same with each other by diffusion of silver, a method of performing compression molding, or a method of stacking the strands in a flat pipe, for example. In case of a long wire, it is effective to wire-draw and twist the strands after integrating the same with each other.

The tape-shaped strands are preferably previously heat treated in advance of twisting. It is possible to reinforce grain bonding of the oxide superconductor for attaining a high critical current density by further performing a heat treatment after forming the oxide superconductor by this heat treatment and performing the step of twisting etc.

According to the present invention, the method preferably further comprises a step of previously coating the outer peripheries of the strands with a material having higher resistance than silver before twisting the metal-coated strands for preparing the stranded wire.

The coating layers consisting of a material having higher resistance than silver can be formed by a method of adding Ni or Cr of high resistance to the outer surfaces of the strands by plating, or a method of applying a solution in which powder of an oxide insulating material such as $AlO_3$ is dispersed to the outer surfaces of the strands, for example.

Alternatively, coating layers consisting of a metal such as Mg or Cu may be formed on the outer peripheries of the strands so that these layers are thereafter oxidized to form coating layers consisting of an oxide insulating material such as MgO or CuO. In particular, excellent workability can be attained by performing an oxidizing step after the rolling of the stranded wire. Mg or Cu is richer in workability than MgO or CuO, and hence the stranded wire can be molded and rolled into a better shape by oxidizing the coating layers after performing twisting and rolling.

According to the present invention, the method preferably further comprises a step of previously coating the flat-molded stranded wire with a metal before rolling.

If the outermost layer of a flat-molded multinary stranded wire is so thin that superconducting filaments may be exposed through the subsequent rolling step, the stranded wire is preferably coated with a metal in advance.

Metal coating layers may be further formed on the outer peripheries of the strands which are coated with a metal such as silver or a silver alloy by performing metal coating on the surface of the flat-molded multinary stranded wire or engagement in a flat metal pipe.

According to the present invention, further, each strand is preferably a multifilamentary wire which is formed by embedding a plurality of superconductors in a metal matrix. Due to a plurality of superconducting filaments provided in each strand, flexibility of the wire is improved.

According to the present invention, the strands themselves are preferably subjected to twisting. Due to such twisting of the strands themselves, bonding loss and eddy current loss are reduced thereby reducing ac loss as a result.

According to the present invention, the method preferably further comprises a step of temporarily heat treating the flat-molded stranded wire before rolling. Workability in rolling can be improved by heat treating the flat-molded stranded wire at about 800° C. for diffusion-bonding the strands with each other.

According to the present invention, further, a step of winding strands around a core of a flat-molded stranded wire and flat-molding the same is preferably repeated a plurality of times.

A wire having low loss and a high capacitance can be obtained by repeating flat-twisting/molding a plurality of times. Such a wire is effective as a material for forming a compact cable conductor having low loss and a high capacitance.

According to still another aspect of the present invention, an oxide superconducting cable conductor is provided. This oxide superconducting cable conductor is formed by assembling oxide superconducting wires on a cylindrical former. Each oxide superconducting wire is a flat-molded stranded wire which is formed by twisting a plurality of metal-coated strands consisting of an oxide superconductor. This flat-molded stranded wire has a rectangular sectional shape, while a section of each strand forming the flat-molded stranded wire has an aspect ratio of at least 2.

In a single-layer cable conductor formed by assembling oxide superconducting wires on a former in a single layer, for example, all strands are dislocated to occupy positions which are electromagnetically completely equivalent to each other, whereby current distribution in the conductor is so uniformalized that increase of ac loss caused by a drift can be prevented. When wires are spirally wound on a former, on the other hand, it is effective to form the conductor in a two-layer structure so that first and second layers are wound in opposite directions, in order to cancel a magnetic field component along the longitudinal direction of the conductor.

Thus, a drift between the layers caused by impedance difference therebetween as well as following ac loss can be minimized as compared with a multilayer conductor, by forming the conductor in a single- or two-layer structure.

According to the present invention, as hereinabove described, a metal-coated oxide superconducting wire having a high critical current density which can transmit a current with los loss can be obtained.

According to the present invention, further, it is also possible to increase the critical current per wire beyond 100 A by increasing the number of stranded wires and the degree of twisting, i.e., the number of times of twisting, so that the inventive wire is usefully applied to an oxide superconducting cable or a superconducting magnet which is employed for carrying a high capacitance alternating current.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

$Bi_2O_3$, PbO, $SrCO_3$, $CaCO_3$ and CuO were blended with each other so that Bi, Pb, Sr, Ca and Cu were in composition ratios of 1.81:0.30:1.92:2.01:3.03. The blended powder was heat treated a plurality of times. This powder was crushed after each heat treatment. The powder obtained through such a heat treatment and crushing was further crushed by a ball mill, to obtain submicron powder.

Precursor powder obtained in the aforementioned manner was heat treated at 800° C. for 2 hours, and thereafter charged in a silver pipe of 12 mm in outer diameter and 8 mm in inner diameter. Then, the silver pipe charged with the powder was drawn into 0.9 mm, to prepare strands. Seven such strands were twisted to prepare the so-called primary stranded wire. Further, 15 such primary stranded wires were twisted and thereafter compression-molded, for preparing a flat-molded secondary stranded wire.

Figure 1:
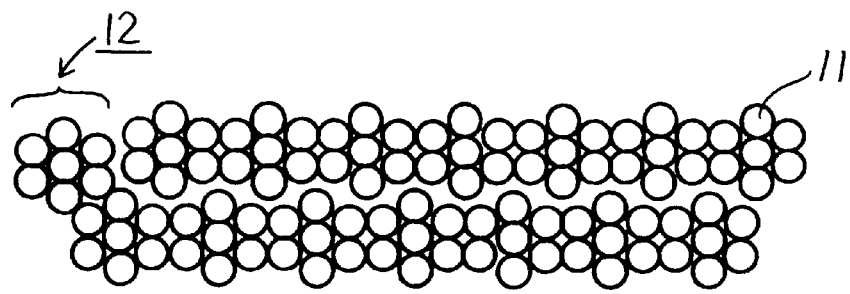
FIG. 1 is a sectional view showing an intermediate in a step of preparing an oxide superconducting wire according to Example 1 of the present invention.

FIG. 1 is a sectional view showing the structure of the secondary stranded wire prepared in the aforementioned manner. Referring to FIG. 1, 15 primary stranded wires 12 each formed by twisting seven strands 11 are further twisted.

Then, the secondary stranded wire was heat treated at 800° C. for 2 hours so that the strands were integrated with each other by diffusion bonding, and thereafter rolled. Then, the stranded wire was heat treated at 845° C. for 50 hours, further rolled and thereafter heat treated at 840° C. for 50 hours.

Figure 2:
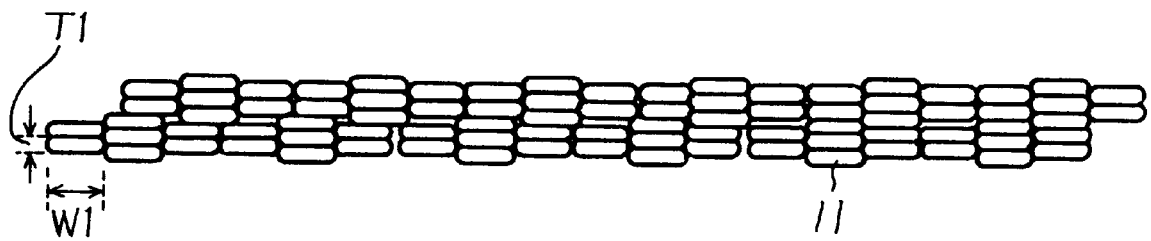
FIG. 2 is a sectional view showing the structure of the oxide superconducting wire according to Example 1 of the present invention.

FIG. 2 is a sectional view showing the structure of an oxide superconducting wire obtained in the aforementioned manner. Referring to FIG. 2, the flat-molded stranded wire has a rectangular sectional shape in this wire, and each strand 11 has a flat section having an aspect ratio (W1/T1) of about 4.

Then, the oxide superconducting wire obtained in the aforementioned manner was subjected to measurement of a critical current value Ic in liquid nitrogen. Consequently, this wire exhibited a value Ic of 50 A.

Ac loss values of a multilayer conductor which was formed by stacking five Bi-based Ag-coated single-filamentary wires having a critical current value Ic of 10 A and the inventive wire were measured by an energization four-probe method. Consequently, it has been confirmed that the ac loss of the inventive wire was smaller than that of the multilayer conductor in a region of not more than 50 Ap.

EXAMPLE 2

Precursor powder having a composition equal to that of the precursor powder employed in Example 1, which was obtained similarly to Example 1, was heat treated at 800° C. for 2 hours, and thereafter charged in a silver pipe of 12 mm in outer diameter and 9 mm in inner diameter. Then, the silver pipe charged with the powder was drawn into 0.9 mm, to prepare strands. Seven such strands were twisted to form the so-called primary stranded wire. Further, 15 such primary stranded wires were twisted and thereafter compression-molded, to prepare a flat-molded secondary stranded wire.

Then, the secondary stranded wire was engaged in a flat silver pipe of 1 mm in thickness, subjected to diffusion bonding at 800° C. for 2 hours, and thereafter rolled. Then, the pipe was heat treated at 845° C. for 50 hours, further rolled and thereafter heat treated at 840° C. for 50 hours.

In the structure of an oxide superconducting wire obtained in the aforementioned manner, the flat-molded stranded wire had a rectangular sectional shape, and each strand had a flat section having an aspect ratio of about 4, similarly to Example 1.

Then, the oxide superconducting wire obtained in the aforementioned manner was subjected to measurement of a critical current value Ic in liquid nitrogen. Consequently, this wire exhibited a value Ic of 50 A.

Ac loss values of a multilayer conductor which was formed by stacking five Bi-based Ag-coated single-filamentary wires having a critical current value Ic of 10 A and the inventive wire were measured by an energization four-probe method. Consequently, it has been confirmed that the ac loss of the inventive wire was smaller than that of the multilayer conductor in a region of not more than 50 Ap.

EXAMPLE 3

Precursor powder having a composition equal to that of the precursor powder employed in Example 1, which was obtained similarly to Example 1, was heat treated at 800° C. for 2 hours, and thereafter charged in a silver pipe of 12 mm in outer diameter and 9 mm in inner diameter. Then, the silver pipe charged with the powder was drawn into 0.9 mm, and seven such wires were engaged in a silver pipe and drawn to prepare a seven-conductor multifilamentary wire. Further, the seven-conductor multifilamentary wire was twisted at a pitch of 20 mm. Seven strands consisting of such twisted seven-conductor multifilamentary wires were twisted, to prepare the so-called primary stranded wire. Further, 15 such primary stranded wires were twisted and thereafter compression-molded, to prepare a flat-molded secondary stranded wire.

Then, this secondary stranded wire was engaged in a flat silver pipe of 1 mm in thickness, subjected to diffusion bonding at 800° C. for 2 hours, and thereafter rolled. Then, the pipe was heat treated at 845° C. for 50 hours, further rolled and thereafter heat treated at 840° C. for 50 hours.

In the structure of an oxide superconducting wire obtained in the aforementioned manner, the flat-molded stranded wire had a rectangular sectional shape similarly to Example 1, and each strand had a flat section having an aspect ratio of about 5.

Then, the oxide superconducting wire obtained in the aforementioned manner was subjected to measurement of a critical current value Ic in liquid nitrogen. Consequently, the inventive wire exhibited a value Ic of 40 A.

Ac loss values of a multilayer conductor which was formed by stacking four Bi-based Ag-coated single-filamentary wires having a critical current value Ic of 10 A and the inventive wire were measured by an energization four-probe method. Consequently, it has been confirmed that the ac loss of the inventive wire was smaller than that of the multilayer conductor in a region of not more than 40 Ap.

EXAMPLE 4

Precursor powder having a composition equal to that of the precursor powder employed in Example 1, which was obtained similarly to Example 1, was heat treated at 800° C. for 2 hours, and thereafter charged in a silver pipe of 12 mm in outer diameter and 10 mm in inner diameter. Seven such silver pipes charged with the powder were drawn and further engaged in a silver pipe of 12 mm in outer diameter and 9 mm in inner diameter to form a seven-conductor wire, which in turn was drawn into 0.9 mm.

Seven strands consisting of seven-conductor wires obtained in the aforementioned manner were twisted to prepare the so-called primary stranded wire. Further, 15 such primary stranded wires were twisted and thereafter compression-molded, to prepare a flat-molded secondary stranded wire.

Then, this secondary stranded wire was engaged in a flat silver pipe of 1 mm in thickness, which in turn was rolled, heat treated at 845° C. for 50 hours, further rolled and thereafter heat treated at 840° C. for 50 hours.

In the structure of an oxide superconducting wire obtained in the aforementioned manner, the flat-molded stranded wire had a rectangular sectional shape similarly to Example 1, and each strand had a flat section having an aspect ratio of about 5.

Then, the oxide superconducting wire obtained in the aforementioned manner was subjected to measurement of a critical current value Ic in liquid nitrogen. Consequently, this wire exhibited a value Ic of 40 A.

Ac loss values of a multilayer conductor which was formed by stacking four Bi-based Ag-coated single-filamentary wires having a critical current value Ic of 10 A and the inventive wire were measured by an energization four-probe method. Consequently, it has been confirmed that the ac loss of the inventive wire was smaller than that of the multilayer conductor in a region of not more than 40 Ap.

EXAMPLE 5

Precursor powder having a composition equal to that of the precursor powder employed in Example 1, which was obtained similarly to Example 1, was heat treated at 800° C. for 2 hours, and thereafter charged in a silver pipe of 24 mm in outer diameter and 20 mm in inner diameter. Then, 61 such silver pipes charged with the powder were drawn into diameters of 1.02 mm and further engaged in a silver pipe of 24 mm in outer diameter and 20 mm in inner diameter, which in turn was further drawn into a diameter of 1.02 mm, to form a strand. 12 such strands were twisted and flat-molded.

Figure 3:
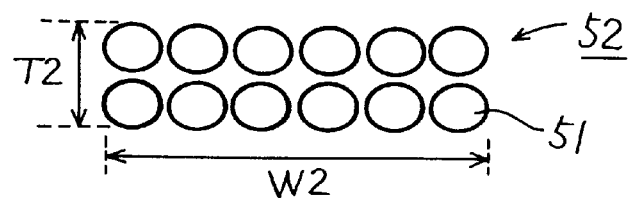
FIG. 3 is a sectional view showing an intermediate in a step of preparing an oxide superconducting wire according to Example 5 of the present invention.

FIG. 3 is a sectional view showing the structure of a flat-molded stranded wire 52 obtained in the aforementioned manner. Referring to FIG. 3, this stranded wire 52 had a width W2 of 7.4 mm, and a thickness T2 of 1.45 mm.

Then, this wire was rolled into a thickness of 1 mm, and thereafter heat treated at 845° C. for 50 hours. Then the wire was rolled into 0.9 mm, and thereafter heat treated at 840° C. for 50 hours.

Figure 4:
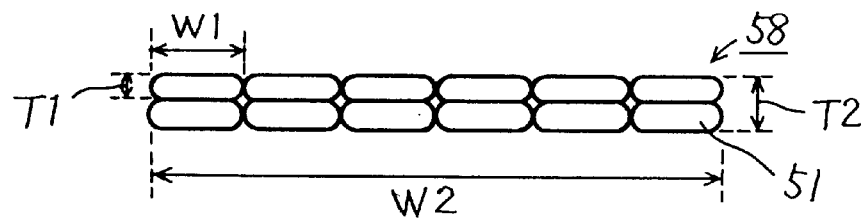
FIG. 4 is a sectional view showing an intermediate in another step of preparing an oxide superconducting wire according to Example 5 of the present invention.

FIG. 4 is a sectional view showing the structure of a reacted flat-molded stranded wire 58 according to the present invention obtained in the aforementioned manner.

Referring to FIG. 4, this stranded wire 58 had a width W2 of 12 mm, and a thickness T1 of 1 mm. Each strand 51 forming the stranded wire 58 had an aspect ratio (W1/T1) of 4.4. As a result of a detailed analysis, each superconducting filament provided in each strand 51 had a width of about 100 $\mu$m and a thickness of about 10 $\mu$m. The volume percentage of a Bi 2223 phase was about 95%. Further, this superconducting flat-molded stranded wire had a critical current value Ic of 110 A.

Throughout the specification, the term "volume percentage" indicates the ratio of a magnetization rate exhibited by each sample in practice with respect to a magnetization rate ($-1/4_\pi$[emU/cc]) which is measured when a superconductor exhibits complete diamagnetism.

Figure 5:
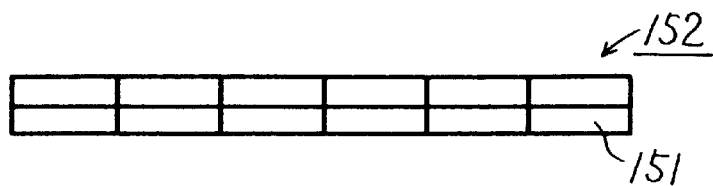
FIG. 5 is a sectional view showing the structure of another exemplary oxide superconducting wire according to Example 5 of the present invention.

FIG. 5 is a sectional view showing the structure of another exemplary oxide superconducting wire 152 after rolling. The superconducting wire 152 having absolutely no clearances between strands 151 can be obtained by rolling the same under a condition of setting a draft at 30 to 40% while providing guides on both sides thereof.

As comparative example, a substance obtained by engaging 61 conductors and thereafter drawing the same into a diameter of 1.02 mm similarly to the aforementioned wire was rolled into a thickness of 0.25 mm, and heat treated at 845° C. for 50 hours to prepare a wire. Four such wires were stacked, rolled into a thickness of 0.9 mm and heat treated at 840° C for 50 hours, to be subjected to measurement of a critical current value Ic. Consequently, this comparative example exhibited a value Ic of 100 A.

Further, ac loss values of the aforementioned two types of wires were measured by an energization four-probe method. Consequently, the ac loss of the flat stranded wire was 0.05 mW/m while that of comparative example was 0.5 mW/m in energization under 60 Hz and 20 $A_{rms}$. Thus, it has been recognized that the ac loss was reduced to 1/10 in the inventive wire.

EXAMPLE 6

Cr or Ni was plated on the surfaces of the strands prepared in Example 5. 12 such strands were twisted and flat-molded. After the molding, the stranded wire had a width of 7.4 mm and a thickness of 1.45 mm. This wire was rolled into a thickness of 1 mm, and thereafter heat treated at 845° C. for 50 hours. Thereafter the wire was rolled into 0.9 mm, and thereafter heat treated at 840° C. for 50 hours.

Figure 6:
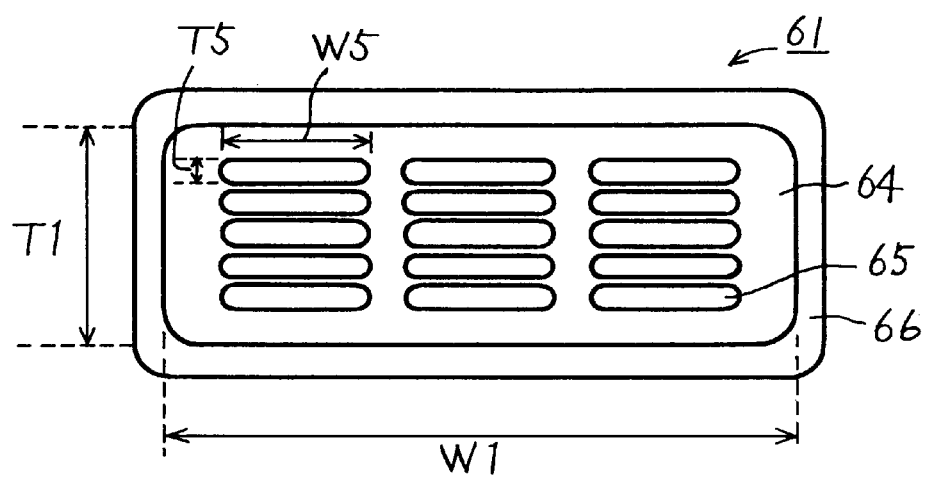
FIG. 6 is a sectional view showing the structure of a strand forming an oxide superconducting wire according to Example 6 of the present invention.

FIG. 6 is a sectional view showing the structure of each strand 61 forming the flat-molded stranded wire obtained in the aforementioned manner.

Referring to FIG. 6, this strand 61 had a flat shape at an aspect ratio (W1/T1) of 3.7, and comprised a coating layer 66 consisting of Cr or Ni plating on its outer periphery. Further, the strand 61 was formed by embedding 61 superconductor filaments 65 in a matrix 64 consisting of silver, and each filament 65 had a width W5 of about 90 $\mu$m and a thickness T5 of about 10 $\mu$m.

The arrangement of the filaments 65 shown in FIG. 6 is a mere example, and the present invention is not necessarily restricted to such arrangement.

The volume percentage of a Bi 2223 phase was about 95%, and the critical current value Ic was 105 A.

Ac loss of this wire which was measured by an energization four-probe method was 0.01 mW/m in energization under 20 A. Thus, it has been recognized that the ac loss was reduced to 1/5 as compared with the strand of Example 1.

EXAMPLE 7

Precursor powder having a composition equal to that of the precursor powder employed in Example 1, which was obtained similarly to Example 1, was charged in a silver pipe of 24 mm in outer diameter and 20 mm in inner diameter. 61 such silver pipes were drawn into diameters of 1.02 mm and engaged in an Ag—Mn alloy pipe of 24 mm in outer diameter and 20 mm in inner diameter, which in turn was drawn into a diameter of 1.02 mm. Thereafter this wire was twisted at a pitch of 25 mm and thereafter rolled into a width of 3 mm and a thickness of 0.25 mm, to prepare a tape-shaped strand.

Figure 7:
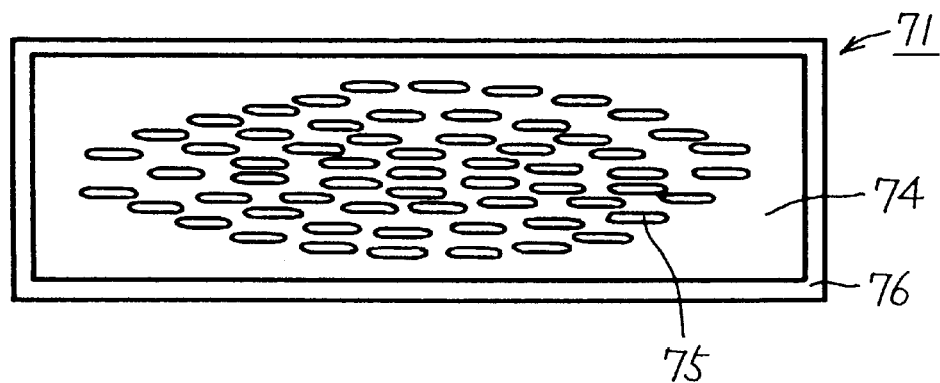
FIG. 7 is a sectional view showing the structure of a strand employed for an oxide superconducting wire according to Example 7 of the present invention.

FIG. 7 is a sectional view showing the structure of a tape-shaped strand 71 obtained in the aforementioned manner. Referring to FIG. 7, this strand 71 is formed by embedding 61 superconducting filaments 75 in a matrix 74 consisting of silver, and a coating layer 76 consisting of an Ag—Mn alloy is formed on its outer periphery.

Figure 8:
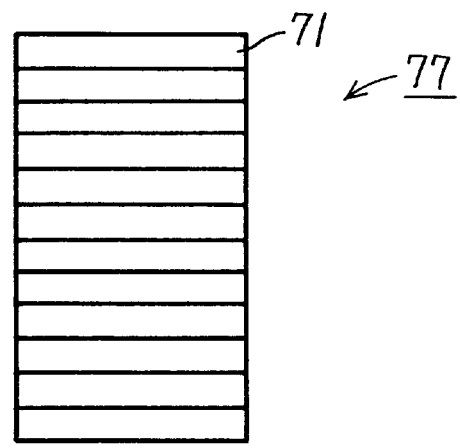
FIG. 8 is a sectional view showing an intermediate in a step of preparing an oxide superconducting wire according to Example 7 of the present invention.
Figure 9:
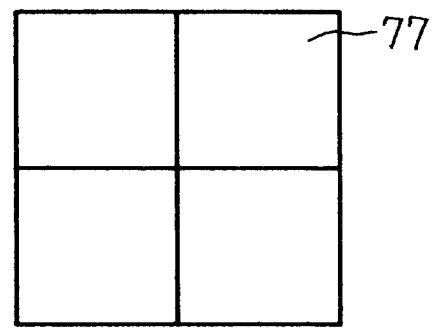
FIG. 9 is a sectional view showing an intermediate in another step of preparing an oxide superconducting wire according to Example 7 of the present invention.

Then, 12 tape-shaped strands 71 obtained in the aforementioned manner were stacked as shown in FIG. 8, and heat treated at 840° C. for 50 hours. Thus, a multilayer wire 77 obtained in this manner was flat-drawn so that each side was 1 mm, and thereafter four such wires were twisted and flat-molded as shown in FIG. 9. In the molding, the thickness was reduced by 10%. This wire was heat treated at 840° C. for 50 hours.

Figure 10:
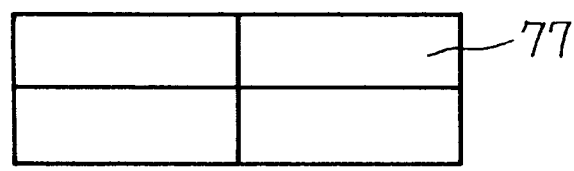
FIG. 10 is a sectional view showing the structure of the oxide superconducting wire according to Example 7 of the present invention.

FIG. 10 is a sectional view showing the structure of an oxide superconducting wire obtained in the aforementioned manner. Referring to FIG. 10, this wire is a flat-molded stranded wire formed by twisting four multilayer wires 77.

Then, the oxide superconducting wire obtained in the aforementioned manner was subjected to measurement of a critical current value Ic in liquid nitrogen. Consequently, this wire exhibited a value Ic of 50 A.

In this oxide superconducting wire, each superconducting filament had a width of about 30 μm and a thickness of about 3 μm.

Further, ac loss values of the flat-molded stranded wire obtained in the aforementioned manner and a 61-conductor wire having a critical current value Ic of 50 A, which was obtained by engaging 61 conductors and thereafter drawing, rolling and heat treating the same similarly to comparative example prepared in relation to Example 5, were measured by an energization four-probe method. Consequently, the ac loss of the flat stranded wire was 0.1 mW/m while that of comparative example was 4 mW/m in energization under 20 $A_{peak}$. Thus, it has been recognized that the ac loss was reduced to 1/40 in the inventive wire.

EXAMPLE 8

Figure 11:
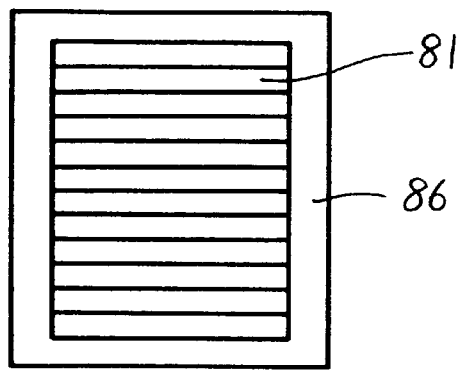
FIG. 11 is a sectional view showing an intermediate in a step of preparing an oxide superconducting wire according to Example 8 of the present invention.

The tape-shaped wire 71 shown in FIG. 7 employed in Example 7 was heat treated at 845° C. for 50 hours, and thereafter rolled into a thickness of 0.2 mm. Then, Cr plating was performed on its surface. Then, 12 strands 81 having Cr-plated surfaces were stacked and inserted in a silver flat pipe 86, as shown in FIG. 11. A multilayer wire 87 obtained in this manner was flat-drawn so that each side was 1 mm, and 12 such wires were further twisted and flat-molded. This wire was heat treated at 840° C. for 50 hours.

Figure 12:
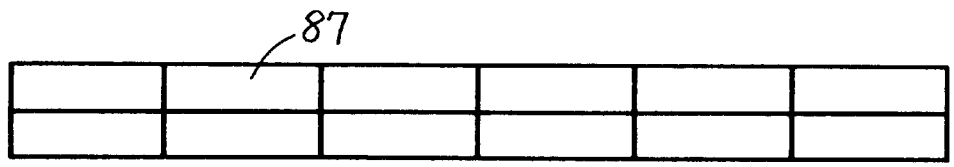
FIG. 12 is a sectional view showing the structure of the oxide superconducting wire according to Example 8 of the present invention.

FIG. 12 is a sectional view showing the structure of an oxide superconducting wire obtained in the aforementioned manner. Referring to FIG. 12, this wire is a flat-molded stranded wire formed by twisting 12 multilayer wires 87.

Then, the oxide superconducting wire obtained in the aforementioned manner was subjected to measurement of a critical current value Ic in liquid nitrogen. Consequently, this wire exhibited a value Ic of 150 A.

In this oxide superconducting wire, each superconducting filament had a width of about 30 μm and a thickness of about 3 μm.

Further, ac loss values of the flat-molded stranded wire obtained in the aforementioned manner and a wire obtained by stacking two 61-conductor wires having a critical current value Ic of 70 A, each of which was obtained by engaging 61 conductors, and thereafter drawing, rolling and heat treating the same similarly to comparative example prepared in relation to Example 5, were measured by an energization four-probe method. Consequently, the ac loss of the flat stranded wire was 0.2 mW/m while that of comparative example was 4 mW/m in energization under 20 $A_{peak}$. Thus, it has been recognized that the ac loss was reduced.

EXAMPLE 9

Two types of wires were prepared by plating surfaces of strands of 1.02 mm in diameter prepared in Example 5 with Mg and Cu in thicknesses of 10 μm. Then, 12 such strands were twisted and flat-molded similarly to Example 1, and thereafter subjected to rolling and a heat treatment twice to form an oxide superconducting flat-molded stranded wire.

In the superconducting wires obtained in this manner, Cu on the surfaces of strands was oxidized into CuO while Mg was also oxidized into MgO by the heat treatment which was repeated twice. Consequently, the strands were substantially completely insulated from each other.

Then, a critical current value Ic in liquid nitrogen was measured as to the oxide superconducting wire obtained in the aforementioned manner. Consequently, this wire exhibited a value Ic of 98 A. Thus, it is understood that Cu or Mg is entirely is oxidized in the heat treatment so that only oxide films of CuO or MgO are formed on the strand surfaces when the Mg or Cu plating films formed on the strand surfaces are sufficiently reduced in thickness. Thus, it has been confirmed that the superconductivity of the wire was not influenced by Mg or Cu in this case.

Further, ac loss was measured as to the oxide superconducting wire obtained in the aforementioned manner. Consequently, ac loss in energization under 20 $A_{peak}$ was 0.01 mW/m in the case of forming CuO films on the strand surfaces, and 0.02 mW/m in the case of forming MgO films on the strand surfaces. Thus, it has been confirmed that bonding loss between the strands could be extremely reduced in both cases.

EXAMPLE 10

A solution which was prepared by dispersing alumina powder in an organic solvent was applied to the surfaces of the strands of 1.02 mm in diameter prepared in Example 5. Then, 12 such strands were twisted and flat-molded similarly to Example 1, and thereafter subjected to rolling and a heat treatment twice to prepare an oxide superconducting flat-molded stranded wire.

In the superconducting wire obtained in the aforementioned manner, alumina was uniformly dispersed in the surfaces of the strands by the heat treatment which was repeated twice. Consequently, the strands were substantially completely insulated from each other.

Then, the oxide superconducting wire obtained in the aforementioned manner was subjected to measurement of a critical current value Ic in liquid nitrogen. Consequently, this wire exhibited a value Ic of 89 A.

Further, ac loss was measured as to the oxide superconducting wire obtained in the aforementioned manner. Consequently, ac loss in energization under 20 $A_{peak}$ was 0.02 mW/m, and it has been confirmed that bonding loss between the strands could be extremely reduced.

EXAMPLE 11

Strands and a flat-molded stranded wire were prepared under conditions absolutely similar to those of Example 5, except that an Ag—Mn or Ag—Au alloy pipe was employed as a sheath material in place of the silver pipe. The obtained superconducting wire was subjected to measurement of a critical current value Ic in liquid nitrogen and ac loss under 51 Hz and 20 $A_{peak}$. Table 1 shows results of comparison of characteristics.

In this oxide superconducting wire, each superconducting filament had a width of about 110 $\mu$m, and a thickness of 9 $\mu$m.

TABLE 1

|  | Comparative Example | Example 5 | Example 6 | Example 11 | Example 11 |
|---|---|---|---|---|---|
| Sheath Material (Matrix) | Ag | Ag | Ag | Ag–Mn | Ag–Au |
| High Resistance Phase | no | no | Cr, Ni | no | no |
| Structure | four stacked layers | flat-molded | flat-molded | flat-molded | flat-molded |
| Ic | 100 A | 110 A | 105 A | 90 A | 108 A |
| AC Loss (51 Hz, 20 $A_{peak}$) | 0.5 mW/m | 0.05 mW/m | 0.01 mW/m | 0.03 mW/m | 0.02 mW/m |

Referring to Table 1, it has been recognized that bonding loss between strands is considerably reduced and ac loss is consequently reduced when a silver alloy of high resistance is employed for metal coatings of the strands.

EXAMPLE 12

Figure 13:
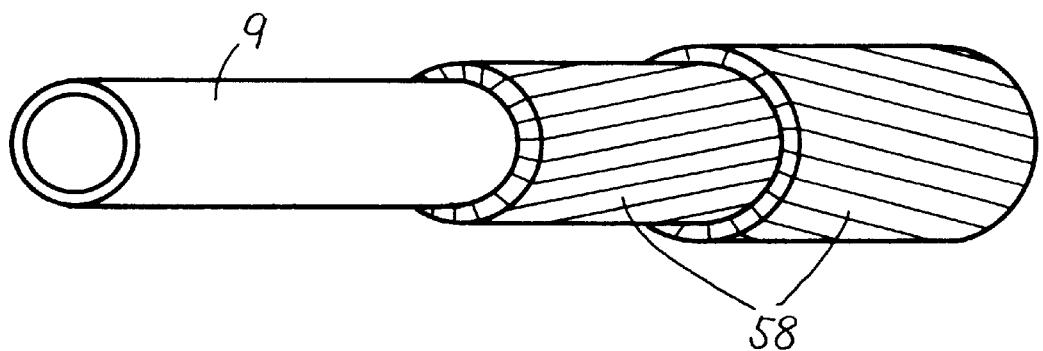
FIG. 13 is a perspective view showing the structure of an oxide superconducting cable conductor according to Example 12 of the present invention.
Figure 14:
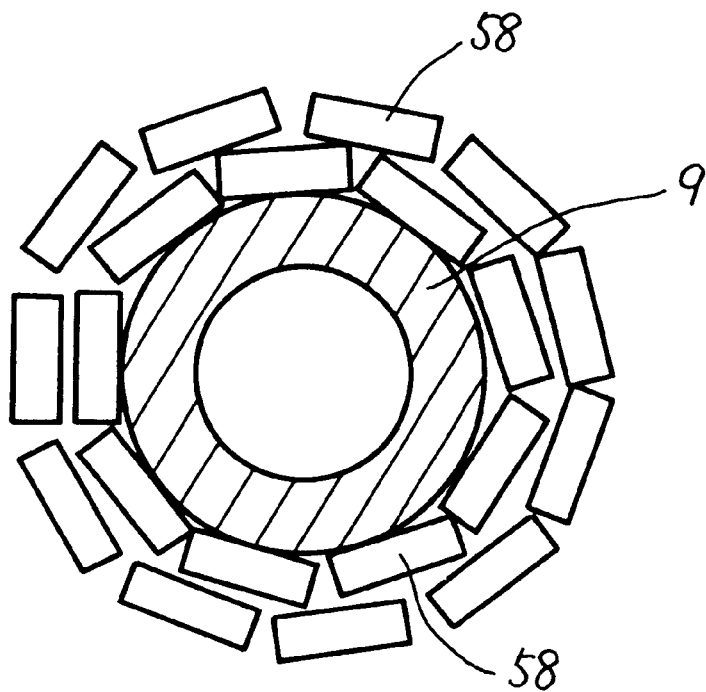
FIG. 14 is a sectional view showing the structure of the oxide superconducting cable conductor according to Example 12 of the present invention.

FIG. 13 is a perspective view showing the structure of an exemplary oxide superconducting cable conductor according to the present invention, and FIG. 14 is a sectional view thereof.

Referring to FIGS. 13 and 14, this oxide superconducting cable conductor is formed by spirally assembling oxide superconducting wires 58 of Example 5 shown in FIG. 4 on a Cu pipe 9 in two layers. The first and second layers are assembled in S twist (anticlockwise) and Z twist (clockwise) respectively. The oxide superconducting cable conductor obtained in this manner was subjected to measurement of a critical current value Ic in liquid nitrogen. Consequently, this cable conductor exhibited a value Ic of 1500 A.

For the purpose of comparison, four layers of 61-conductor wires having a critical current value Ic of 25 A, each of which was obtained by engaging 61 conductors and thereafter drawing, rolling and heat treating the same similarly to the comparative wire prepared in relation to Example 5, were assembled on a Cu pipe of the same size as the above, to prepare a cable conductor having a critical current value Ic of 1500 A. Ac loss values were measured as to these two cable conductors. Consequently, the stranded wire two-layer conductor according to the present invention exhibited a value which was smaller by two digits than that of the four-layer conductor of comparative example.

EXAMPLE 13

The flat-molded stranded wire 52 prepared in Example 5 as shown in FIG. 3, which was not yet rolled and heat treated, was employed as a core so that 16 strands 51 employed in Example 5 were wound on its periphery, and flat-molded. This wire was rolled into a thickness of 2 mm, and thereafter heat treated at 845° C. for 50 hours. Then the wire was rolled into a thickness of 1.9 mm, and thereafter heat treated at 840° C. for 50 hours.

Figure 15:
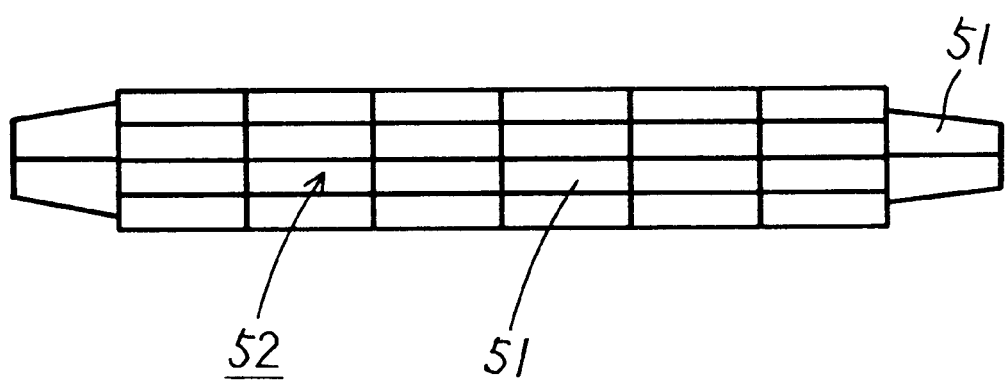
FIG. 15 is a sectional view showing the structure of an oxide superconducting wire according to Example 13 of the present invention.

FIG. 15 is a sectional view showing the structure of the oxide superconducting wire obtained in the aforementioned manner.

Then, the oxide superconducting wire obtained in the aforementioned manner was subjected to measurement of a critical current value Ic in liquid nitrogen. Consequently, this wire exhibited a value Ic of 230 A.

As comparative example, 10 wires each obtained by engaging 61 conductors and thereafter drawing, rolling and heat treating the same similarly to Example 5 were stacked, rolled into a thickness of 2 mm and heat treated at 840° C. for 50 hours, to be subjected to measurement of a critical current value Ic. Consequently, this wire exhibited a value Ic of 250 A.

Further, ac loss values of the aforementioned two types of wires were measured by an energization four-probe method. Consequently, the ac loss of the flat stranded wire was 0.3 mW/m while that of comparative example was 2 mW/m in energization under 100 $A_{rms}$. Thus, it has been recognized that the ac loss was reduced.

EXAMPLE 14

The flat-molded stranded wire prepared in Example 6 was employed to prepare an oxide superconducting cable conductor having the same structure as Example 12. The obtained oxide superconducting cable conductor exhibited a critical current value Ic of 1400 A in liquid nitrogen. Further, this conductor exhibited ac loss which was lower by 100% than that of the cable conductor according to Example 12.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing an oxide superconducting wire, comprising the steps of:

previously coating the outer peripheries of a plurality of strands with a material having a higher resistance than silver, each strand being formed by metal-coating an oxide superconductor or raw material powder therefor:

preparing a stranded wire by twisting the plurality of strands in order to equalize impedance of the strands forming the stranded wire;

flat-molding said prepared stranded wire; and repeating rolling and a heat treatment of at least 800° C. on said flat-molded stranded wire a plurality of times to obtain an oxide superconducting wire having an insulating oxide layer formed on an outer surface of said stranded wire, for reducing AC loss in the oxide superconducting wire;

wherein said strands are previously twisted.

2. A method of preparing an oxide superconducting wire, comprising:

previously coating the outer peripheries of a plurality of strands with a material having a higher resistance than silver, each strand being formed by metal-coating an oxide superconductor or raw material powder therefor;

preparing a stranded wire by twisting the plurality of strands to equalize impedance of the strands forming the stranded wire;

flat-molding the prepared stranded wire; and repeating rolling and a heat treatment of at least 800° C. on the flat-molded stranded wire a plurality of times to obtain an oxide superconducting wire having an insulating oxide layer formed on an outer surface of the stranded wire, for reducing AC loss in the oxide superconducting wire;

wherein the strands are previously twisted.

* * * * *

UNITED STATES PATENT AND TRADEMARK OFFICE
CERTIFICATE OF CORRECTION

PATENT NO. : 6,305,069 B1
DATED : October 23, 2001
INVENTOR(S) : Jun Fujikami, Nobuhiro Sage, Kazuya Ohmatsu and Kenishi Sato It is certified that error appears in the above-identified patent and that said Letters Patent is hereby corrected as shown below:

<u>Title page,</u>
Item [73], Assignee, change "Sumitomo Electric Industries, Inc." to -- Sumitomo Electric Industries, Ltd. --

Signed and Sealed this

Twentieth Day of August, 2002

Attest:

Attesting Officer

JAMES E. ROGAN
*Director of the United States Patent and Trademark Office*